(12) United States Patent
Chang et al.

(10) Patent No.: US 11,715,503 B2
(45) Date of Patent: Aug. 1, 2023

(54) SIGNAL GENERATION CIRCUIT AND MEMORY

(71) Applicant: CHANGXIN MEMORY TECHNOLOGIES, INC., Hefei (CN)

(72) Inventors: Liping Chang, Hefei (CN); Bin Hu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 156 days.

(21) Appl. No.: 17/504,583

(22) Filed: Oct. 19, 2021

(65) Prior Publication Data

US 2022/0310143 A1 Sep. 29, 2022

Related U.S. Application Data

(63) Continuation of application No. PCT/CN2021/112847, filed on Aug. 16, 2021.

(30) Foreign Application Priority Data

Mar. 26, 2021 (CN) .......................... 202110328196.7

(51) Int. Cl.
*G11C 7/10* (2006.01)
*G11C 7/22* (2006.01)
(52) U.S. Cl.
CPC .................................... *G11C 7/222* (2013.01)
(58) Field of Classification Search
CPC ..................................................... G11C 7/1072
USPC ........................................................ 365/194
See application file for complete search history.

(56) References Cited

U.S. PATENT DOCUMENTS

| 6,469,549 | B2 | 10/2002 | Carson |
| 7,154,322 | B2 | 12/2006 | Kim |
| 7,295,488 | B2 | 11/2007 | Hwang |
| 8,344,783 | B2 | 1/2013 | Ko |
| 2002/0063587 | A1 | 5/2002 | Carson |
| 2003/0067812 | A1* | 4/2003 | Kajimoto ............. G11C 7/1072 365/194 |
| 2005/0156647 | A1 | 7/2005 | Kim |
| 2011/0204950 | A1 | 8/2011 | Ko |

FOREIGN PATENT DOCUMENTS

| CN | 1665135 A | 9/2005 |
| CN | 102170279 A | 8/2011 |
| CN | 109302166 A | 2/2019 |
| JP | 2008109577 A | 5/2008 |

* cited by examiner

*Primary Examiner* — Jason Lappas
(74) *Attorney, Agent, or Firm* — Cooper Legal Group, LLC (57) ABSTRACT

Provided are a signal generation circuit and a memory. The signal generation circuit includes: a clock delay circuit for delaying an initial pulse signal to output an intermediate signal delayed by a first delay duration, the first delay duration being equal to one or more clock cycles; a physical delay circuit for delaying the intermediate signal to output a target signal, if an actual delay duration of the physical delay circuit is equal to a second delay duration, the target signal being delayed by a target duration, a difference between the actual and second delay durations fluctuating within a first preset range, and the shorter the second delay duration, the narrower the first preset range; and a generation circuit for outputting a function pulse signal having a pulse width equal to a time interval between rising edges of the initial pulse signal and the target signal.

20 Claims, 5 Drawing Sheets

SIGNAL GENERATION CIRCUIT AND MEMORY

CROSS-REFERENCE TO RELATED APPLICATIONS

This application is a continuation of International Patent Application No. PCT/CN2021/112847, filed on Aug. 16, 2021, which is based on and claims priority to Chinese Patent Application No. 202110328196.7, filed on Mar. 26, 2021 and entitled "SIGNAL GENERATION CIRCUIT AND MEMORY". The disclosures of International Patent Application No. PCT/CN2021/112847 and Chinese Patent Application No. 202110328196.7 are incorporated herein by reference in their entireties.

TECHNICAL FIELD

Embodiments of this disclosure relate to a signal generation circuit and a memory.

BACKGROUND

In a circuit design for a column select signal (CSL) decoder of a DDR4 chip, a pulse width of a CSL signal is restricted to some extent, and a pulse width independent of a clock frequency may be formed by use of a physical delay and is transmitted to a storage structure for operating.

In a conventional CSL signal generation circuit, a CSL pulse width is not affected by a clock frequency, but affected only by the type of a chip process corner, an operating voltage and an operating temperature. When a tape-out process for a chip is unstable, the type of a chip process corner may be unstable, and during actual use of a CSL signal generation circuit, an operating voltage and an operating temperature may be unstable. Therefore, a pulse width of a CSL signal may fluctuate in a large range.

Figure 1:
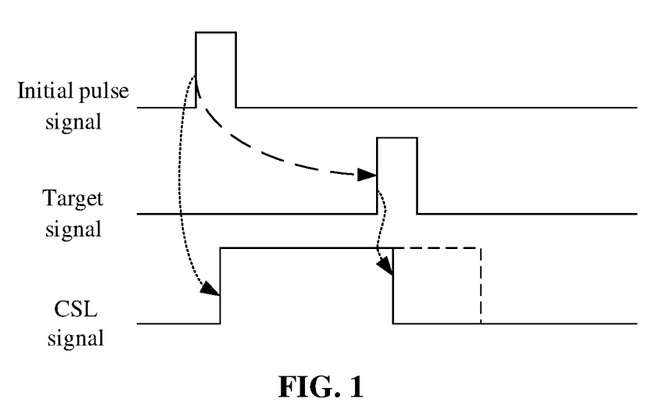
FIG. 1 illustrates a schematic diagram of signal generation.
Figure 2:
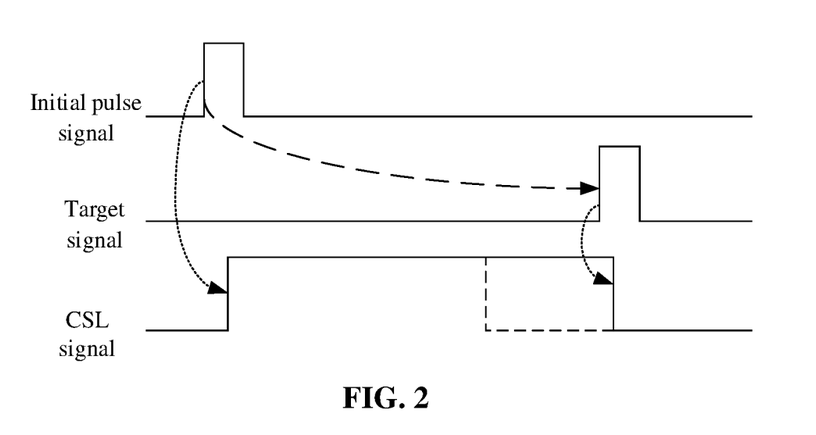
FIG. 2 illustrates a schematic diagram of signal generation.

Referring to FIG. 1, when a chip process corner is a fast-fast process corner (FF corner), an actual delay duration of a target signal obtained by physically delaying an initial pulse signal may be insufficient, resulting in an insufficient actual pulse width of a CSL signal with respect to a preset pulse width (marked with a dotted line). Referring to FIG. 2, when a chip process corner is a slow-slow process corner (SS corner), an actual delay duration of a target signal obtained by physically delaying an initial pulse signal may be overlong, resulting in an overlong actual pulse width of a CSL signal with respect to a preset pulse width (marked with a dotted line). Both of the cases above may cause a failure in data reading and writing, i.e. low effectiveness of a CSL signal.

SUMMARY

Embodiments of this disclosure provide a signal generation circuit and a memory.

A first aspect of the embodiments of this disclosure provides a signal generation circuit, including: a clock delay circuit, configured to receive a clock signal and an initial pulse signal, and delay the initial pulse signal to output an intermediate signal, the intermediate signal being delayed by a first delay duration with respect to the initial pulse signal, and the first delay duration being equal to one or more clock cycles of the clock signal; a physical delay circuit, configured to receive and delay the intermediate signal to output a target signal, a preset delay duration of the physical delay circuit being a second delay duration, wherein when an actual delay duration of the physical delay circuit is equal to the second delay duration, the target signal being delayed by a target duration with respect to the initial pulse signal, a difference between the actual delay duration and the second delay duration fluctuating within a first preset range, and the shorter the second delay duration, the narrower the first preset range; and a generation circuit, configured to receive the initial pulse signal and the target signal, and output a function pulse signal, a pulse width of the function pulse signal being equal to a time interval between a rising edge of the initial pulse signal and a rising edge of the target signal.

A second aspect of the embodiments of this disclosure further provides a memory, including the signal generation circuit of any one of the foregoing embodiments.

BRIEF DESCRIPTION OF THE DRAWINGS

One or more embodiments are illustratively explained in combination with figures in the corresponding accompanying drawings. Unless otherwise stated, the figures in the accompanying drawings do not constitute any restriction in proportion.

DETAILED DESCRIPTION

In order to make the objectives, technical solutions and advantages of embodiments of this disclosure clearer, various embodiments of this disclosure will be described in detail below in combination with the accompanying drawings. However, it can be understood by persons of ordinary skills in the art that, in various embodiments of this disclosure, many technical details have been proposed in order to give the reader a better understanding of this disclosure. However, the technical solutions claimed in this disclosure may be implemented even without these technical details and various changes and modifications based on the following various embodiments.

Figure 3:
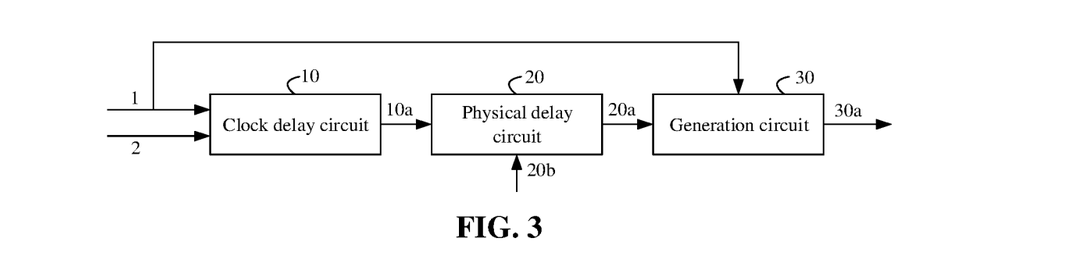
FIG. 3 illustrates a schematic functional structure diagram of a signal generation circuit provided in an embodiment of this disclosure.

Referring to FIG. 3, a signal generation circuit includes: a clock delay circuit 10, configured to receive a clock signal 2 and an initial pulse signal 1, and delay the initial pulse signal 1 to output an intermediate signal 10a, the intermediate signal 10a being delayed by a first delay duration with respect to the initial pulse signal 1, and the first delay duration being equal to one or more clock cycles of the clock signal 2; a physical delay circuit 20, configured to receive and delay the intermediate signal 10a to output a target signal 20a, a preset delay duration of the physical delay circuit 20 being a second delay duration, wherein when an actual delay duration of the physical delay circuit 20 is equal to the second delay duration, the target signal 20a being delayed by a target duration with respect to the initial pulse signal 1, a difference between the actual delay duration and the second delay duration fluctuating within a first preset range, and the shorter the second delay duration, the narrower the first preset range; and a generation circuit 30, configured to receive the initial pulse signal 1 and the target signal 20a and output a function pulse signal 30a, a pulse width of the function pulse signal 30a being equal to a time interval between a rising edge of the initial pulse signal 1 and a rising edge of the target signal 20a.

In this embodiment, the first delay duration is equal to n clock cycles. The clock delay circuit 10 is further configured to output a plurality of intermediate signals 10a. Values of n corresponding to the different intermediate signals 10a are different, and n is a positive integer. The physical delay circuit 20 is further configured to receive a first flag signal 20b indicating a numeric value of the clock cycle, and receive one of the plurality of intermediate signals 10a based on the first flag signal 20b and adjust the second delay duration, so that a sum of the first delay duration and the second delay duration corresponding to the received intermediate signal 10a is equal to the target duration.

When the value of n is large or the numeric value of the clock cycle is large, a total duration of the n clock cycles may be greater than the target duration, that is, the first delay duration corresponding to the intermediate signal 10a may be greater than the target duration. In this case, the physical delay circuit 20 may only receive part of the intermediate signals 10a, and the first delay duration corresponding to the part of the intermediate signals 10a is less than the target duration, so that the sum of the first delay duration and the second delay duration is equal to the target duration.

Further, when the first delay duration corresponding to the plurality of intermediate signals 10a is less than the target duration, the physical delay circuit 20 may receive the intermediate signal 10a having a corresponding first delay duration closest to the target duration, thereby minimizing the second delay duration that is achieved by use of the physical delay circuit 20, and narrowing the first preset range, so that the delay of the target signal 20a with respect to the initial pulse signal 1 is as close to the target duration as possible. Thus, the pulse width of the function pulse signal 30a is accurately controlled to approach the target duration.

In this embodiment, a numeric value of the clock cycle is one of a plurality of different numeric values, and the first delay duration changes as the numeric value of the clock cycle changes. The physical delay circuit 20 is further configured to adjust the second delay duration based on the first delay duration, so that a sum of the first delay duration and the second delay duration is equal to the target duration. As the numeric value of the clock cycle changes, the first delay duration corresponding to the intermediate signal 10a received by the physical delay circuit 20 also changes. In this case, the second delay duration of the physical delay circuit 20 needs to be adjusted in time to ensure that the sum of the first delay duration and the second delay duration is equal to the target duration, so that the pulse width of the function pulse signal 30a is accurately controlled to approach the target duration.

The signal generation circuit is described in detail below with the clock cycle including the first clock cycle and the second clock cycle as an example.

Figure 4:
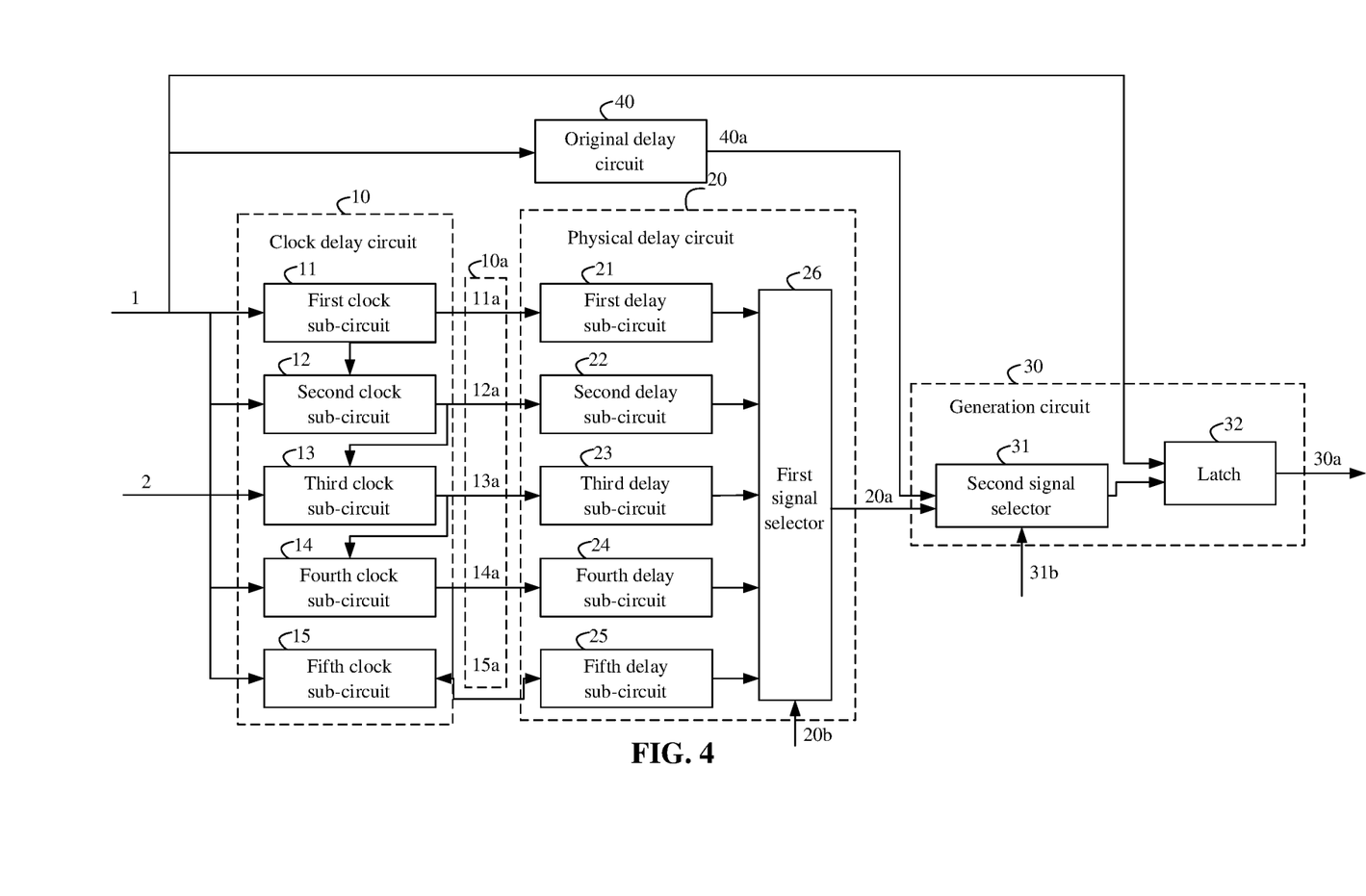
FIG. 4 illustrates a schematic structural diagram of a signal generation circuit provided in an embodiment of this disclosure.

Referring to FIG. 4, the clock delay circuit 10 is configured to output at least a first intermediate signal 11a and a second intermediate signal 12a. A first delay duration corresponding to the first intermediate signal 11a is equal to x clock cycles, a first delay duration corresponding to the second intermediate signal 12a is equal to y clock cycles, and x and y are positive integers. The physical delay circuit 20 includes: a first delay sub-circuit 21 configured to receive the first intermediate signal 11a, a sum of a preset delay duration of the first delay sub-circuit 21 and x first clock cycles being equal to a target duration; a second delay sub-circuit 22 configured to receive the second intermediate signal 12a, a sum of a preset delay duration of the second delay sub-circuit 22 and y second clock cycles being equal to the target duration; and a first signal selector 26, having a first input end thereof connected to an output end of the first delay sub-circuit 21, a second input end thereof connected to an output end of the second delay sub-circuit 22, and an output end thereof connected to an input end of the generation circuit 30, and configured to receive the first flag signal 20b. When the first flag signal 20b indicates that the clock cycle is the first clock cycle, the output end of the first signal selector 26 is controlled to be communicated with the first input end, and the signal output by the first delay sub-circuit 21 is used as the target signal 20a; when the first flag signal 20b indicates that the clock cycle is the second clock cycle, the output end of the first signal selector 26 is controlled to be communicated with the second input end, and the signal output by the second delay sub-circuit 22 is used as the target signal 20a.

That is, when the clock cycle of the clock signal 2 changes, the physical delay circuit 20 may receive another intermediate signal 10a, and adjust the preset delay duration thereof, so that the sum of the first delay duration corresponding to the received intermediate signal 10a and the adjusted preset delay duration is equal to the target duration. It should be noted that when x first clock cycles are equal to y second clock cycles, that is, the first delay duration of the first intermediate signal 11a under the first clock cycle condition is equal to the second delay duration of the second intermediate signal 12a under the second clock cycle condition, the physical delay circuit 20 may also only receive another intermediate signal 10a without adjusting the preset delay duration of the physical delay circuit 20.

In this embodiment, when the value of y is greater than the value of x, the second intermediate signal 12a may be obtained by delaying the first intermediate signal 11a by y-x clock cycles. Specifically, the clock delay circuit 10 may include: a first clock sub-circuit 11, having an output end thereof connected to an input end of the first delay sub-circuit 21, and configured to receive an initial pulse signal 1 and output the first intermediate signal 11a; and a second clock sub-circuit 12 connected between the first clock sub-circuit 11 and the second delay sub-circuit 22, and configured to receive and delay the first intermediate signal 11a and output the second intermediate signal 12a. In this way, it is beneficial to reduce the complexity of the second clock sub-circuit 12, reduce the size of the second clock sub-circuit 12, and reduce the size of the overall signal generation circuit.

In other embodiments, two independent clock sub-circuits may be used to receive the initial pulse signal separately, and form the first intermediate signal and the second intermediate signal respectively. In this way, it is beneficial to avoid the damage of the first clock sub-circuit from causing the second clock sub-circuit to fail to work, and to ensure that the signal generation circuit is at least partially available to work.

In this embodiment, the first clock sub-circuit 11 is composed of x delayers (not shown) connected in series. The delayers each is configured to receive and delay a signal, and a delay duration of each delayer is equal to one clock cycle. The second clock sub-circuit 12 is composed of y-x delays successively connected in series. It should be noted that the delay of each delayer is only related to the clock cycle of the clock signal 2 and has nothing to do with a chip process corner, an actual operating temperature or an actual operating voltage.

Specifically, a pulse width of the initial pulse signal 1 is equal to the clock cycle of the clock signal 2, and the rising edge of the initial pulse signal 1 is the same as a rising edge of the clock signal 2. The delayers each is a D flip-flop, a trigger mode of the D flip-flop is edge trigger, and a trigger input end of the D flip-flop is configured to receive the clock signal 2.

Signal reception and signal outputting of the first clock sub-circuit 11 and the second clock sub-circuit 12 are described below with the first clock sub-circuit 11 including a first D flip-flop and the second clock sub-circuit 12 including a second D flip-flop as an example. A data input end of the first D flip-flop is configured to receive the initial pulse signal 1, a trigger input end is configured to receive the clock signal 2, a data output end is configured to output the first intermediate signal 11a, and a data output end is separately connected to the input end of the first delay sub-circuit 21 and the data input end of the second D flip-flop. The data input end of the second D flip-flop is configured to receive the first intermediate signal 11a, a trigger input end is configured to receive the clock signal 2, a data output end is configured to output the second intermediate signal 12a, and a data output end is connected to the input end of the second delay sub-circuit 22.

The delay principle of the first D flip-flop in this disclosure is described in detail as follows. When the clock signal 2 enters a first rising edge period, the level of the initial pulse signal 1 may be detected, at this time, the initial pulse signal 1 is at a low level or begins to enter a rising edge period but has not risen to a high level, and the first D flip-flop receiving the initial pulse signal 1 may output a low level for one clock cycle; after one clock cycle elapses, when the clock signal 2 enters a second rising edge period, the level of the initial pulse signal 1 may be detected again, at this time, the initial pulse signal 1 is at a high level or begins to enter a falling edge period but has not yet fallen to a low level, and the first D flip-flop receiving the initial pulse signal 1 may output a high level for one clock cycle; after yet another clock cycle elapses, when the clock signal 2 enters a third rising edge period, the level of the initial pulse signal 1 may be detected again, at this time, the initial pulse signal 1 is at a low level, and the first D flip-flop receiving the initial pulse signal 1 may output a low level . . . until the first D flip-flop may achieve a delay of one clock cycle.

It can be understood that the delay principle of the D flip-flop is introduced above with the first D flip-flop as an example only. The delay principles of other D flip-flops configured to receive the intermediate signal 10a or other types of signals are similar to the delay principle of the first D flip-flop, all with the starting time point of the rising edge of the clock signal 2 (i.e., the time point for entering the rising edge period) as a detection time to detect and output the levels of the signals received by the data input end and maintain blocking. Details are not described herein again.

In addition, in some embodiments, the initial pulse signal 1 may be generated based on the clock signal 2. However, since the generation process has a certain delay, although the pulse width of the initial pulse signal 1 is one clock cycle, the rising edge of the initial pulse signal 1 is later than the rising edge corresponding to the clock signal 2. Specifically, referring to FIG. 5, when the clock signal 2 enters the first rising edge period, the initial pulse signal 1 is still at a low level, and at this time, the first intermediate signal 11a is correspondingly at a low level; and when the clock signal 2 enters the second rising edge period, the initial pulse signal 1 is at a high level, and at this time, the first intermediate signal 11a is at a high level. However, since the D flip-flop per se has a certain output time-lag, the starting time point of the rising edge of the first intermediate signal 11a is later than the starting time point of the second rising edge of the clock signal 2.

It should be noted that the output time-lag of the D flip-flop or another physical device is an inevitable defect, and even wires have extremely short output time-lags, which are generally ignored. Therefore, in the field of semiconductors, the expression that the rising edges of different signals are the same does not mean that the rising edges of different signals are exactly the same, but mean that the time intervals between the rising edges of different signals are within a certain range. As long as the time intervals are within the range, the rising edges may be considered "same". "A certain range" is not a fixed threshold range, but a dynamic threshold range that may be impacted by factors such as a process corner type, an operating voltage and an operating temperature.

In this embodiment, the clock cycle may further include a third clock cycle, a fourth clock cycle, or a fifth clock cycle. The clock delay circuit 10 is configured to output at least a third intermediate signal 13a, a fourth intermediate signal 14a, and a fifth intermediate signal 15a. The first delay duration corresponding to the third intermediate signal 13a is equal to a clock cycles, the first delay duration corresponding to the fourth intermediate signal 14a is equal to b clock cycles, the first delay duration corresponding to the fifth intermediate signal 15a is equal to c clock cycles, and a, b and c are positive integers. The physical delay circuit 20 may include: a third delay sub-circuit 23 configured to receive the third intermediate signal 13a, a sum of the preset delay duration of the third delay sub-circuit 23 and a third clock cycles being equal to the target duration; a fourth delay sub-circuit 24 configured to receive the fourth intermediate signal 14a, a sum of the preset delay duration of the fourth delay sub-circuit 24 and b fourth clock cycles being equal to the target duration; and a fifth delay sub-circuit 25 configured to receive the fifth intermediate signal 15a, a sum of the preset delay duration of the fifth delay sub-circuit 25 and c fifth clock cycles being equal to the target duration. A third input end of the first signal selector 26 may be connected to an output end of the third delay sub-circuit 23, a fourth input end of the first signal selector 26 may be connected to an output end of the fourth delay sub-circuit 24, and a fifth input end of the first signal selector 26 may be connected to an output end of the fifth delay sub-circuit 25. The first flag signal 20b may be further used for indicating the third clock cycle, the fourth clock cycle or the fifth clock cycle. The first signal selector 26 is further configured to control the output end of the first signal selector 26 to be connected to the output end of the third delay sub-circuit 23, the output end of the fourth delay sub-circuit 24 or the output end of the fifth delay sub-circuit 25 based on the first flag signal 20b.

In this embodiment, a corresponding number of clock sub-circuits are provided based on the number of the clock cycles. Each clock sub-circuit may generate an intermediate signal 10a, and the number of the intermediate signals 10a is the same as the number of the clock cycles. In addition, the number of the delay sub-circuits is less than or equal to the number of the intermediate signals 10a. When there are k identical values in the duration of x first clock cycles, y second clock cycles, a third clock cycles, b fourth clock cycles, and c fifth clock cycles, 5−k+1 delay sub-circuits may be provided, one of which receives different intermediate signals 10a based on the first flag signal 20b; or, 5 delay sub-circuits are provided, k of which have the equal second delay duration.

It should be noted that the number of numerical intervals of the clock cycle is related to the type of a memory chip and a signal indicated by the first flag signal 20b. In this disclosure, the first flag signal 20b indicates a delay between adjacent column address strobe signals (CAS to CAS command delay), which is called tccd. For common memory chips, parameters of tccd are 4, 5, 6, 7, and 8. That is, there are 5 parameter types of tccd, and correspondingly, the number of numerical intervals of the clock cycle is 5. In other embodiments, the number of clock cycles of the memory chip may be adjusted according to actual requirements.

In this embodiment, the clock delay circuit 10 further includes: a third clock sub-circuit 13 connected between the second clock sub-circuit 12 and the third delay sub-circuit 23, and configured to receive and delay the second intermediate signal 12a and output the third intermediate signal 13a; and a fourth clock sub-circuit 14 connected between the third clock sub-circuit 13 and the fourth delay sub-circuit 24, and configured to receive and delay the third intermediate signal 13a and output the fourth intermediate signal 14a; and a fifth clock sub-circuit 15 connected between the fourth clock sub-circuit 14 and the fifth delay sub-circuit 25, and configured to receive and delay the fourth intermediate signal 14a and output the fifth intermediate signal 15a.

In this embodiment, the signal generation circuit further includes: an original delay circuit 40 configured to receive and delay the initial pulse signal 1 to output an original signal 40a, a preset delay duration of the original delay circuit 40 being a target duration, a difference between an actual delay duration of the original delay circuit 40 and the target duration fluctuating within a second preset range, and the shorter the target duration, the narrower the second preset range. The generation circuit 30 includes: a second signal selector 31 configured to receive the original signal 40a and the target signal 20a, receive a second flag signal 31b and output the original signal 40a or the target signal 20a based on the second flag signal 31b; and a latch 32 configured to receive the initial pulse signal 1 and receive the original signal 40a or the target signal 20a, wherein when the original signal 40a is received, the pulse width of the function pulse signal 30a being equal to a time interval between the rising edge of the initial pulse signal 1 and a rising edge of the original signal 40a.

The second flag signal 31b may be a selection control signal for indicating a user's demand and selection for an operation mode of the signal generation circuit. When a user selects a mode in which the pulse width of the function pulse signal 30a fluctuates less, or selects a mode that is less affected by a process corner, an operating voltage and an operating temperature, the second signal selector 31 may output the target signal; and when the user selects a mode in which the pulse width of the function pulse signal 30a fluctuates greatly or selects a mode that is greatly affected by the process corner, the operating voltage and the operating temperature, i.e., a real environment mode, the second signal selector 31 may output the original signal.

In this embodiment, the latch 32 has a first input end and a second input end. The first input end is configured to receive the initial pulse signal 1, and the second input end is configured to receive the target signal 20a or the original signal 40a. When it is detected that the level of the first input end changes to a high level, the latch 32 may continuously output a high level signal until it is detected that the level of the second input end changes to a high level and the output high level of the latch 32 changes back to a low level. The latch 32 may be provided as an SR latch.

In this embodiment, the physical delay circuits 20 is composed of inverters successively connected in series. Specifically, the physical delay circuit 20 is composed of m inverters successively connected in series, and m is an even number. Each of the inverters has a preset output lag, a sum of m preset output lags is equal to the second delay duration, and the smaller m, the narrower the first preset range. The preset output lag of each inverter may be impacted by a process corner, an operating temperature and an operating voltage. The delay fluctuation of the physical delay circuit 20 is the sum of preset output lag fluctuations of m inverters. The smaller the number of inverters, the smaller the delay fluctuation of the physical delay circuit 20.

It can be understood that each delay sub-circuit in the physical delay circuit 20 is composed of an even number of inverters connected in series, and the number of inverters included in different delay sub-circuits may be the same or different. In addition, herein, the function pulse signal 30a is a column select signal.

The generation of the function pulse signal 30a is described in detail below with the first clock sub-circuit 11, the second clock sub-circuit 12, the third clock sub-circuit 13, the fourth clock sub-circuit 14 and the fifth clock sub-circuit 15 each including only one D flip-flop as an embodiment.

Figure 5:
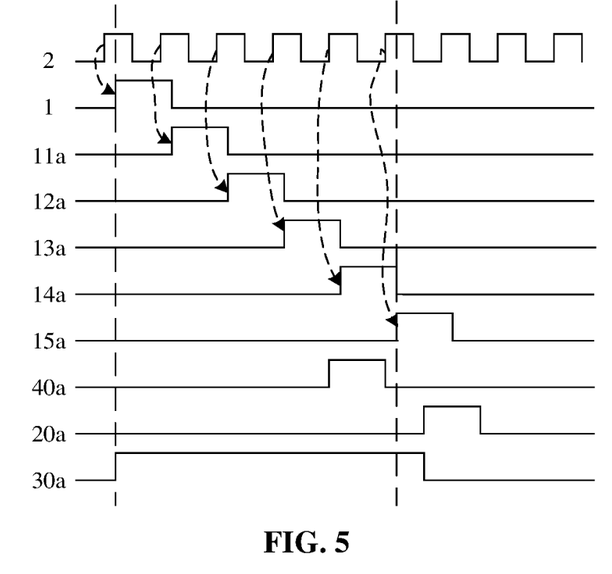
FIG. 5 illustrates a schematic signal diagram of a signal generation circuit provided in an embodiment of this disclosure.

Referring to FIG. 4 and FIG. 5, the initial pulse signal 1 is generated based on the clock signal 2, and the pulse width of the initial pulse signal 1 is equal to one clock cycle of the clock signal 2. However, since the generation device per se has a certain output lag, the starting time point of the rising edge of the initial pulse signal 1 is slightly delayed with respect to the starting time point of the first rising edge of the clock signal 2.

After receiving the initial pulse signal 1, the first clock sub-circuit 11 delays the initial pulse signal 1 by one clock cycle to obtain the first intermediate signal 11a. It should be noted that since the D flip-flop per se also has an output lag, the rising edge of the first intermediate signal 11a is slightly delayed with respect to the second rising edge of the clock signal 2.

Similarly, the second clock sub-circuit 12 delays the first intermediate signal 11a by one clock cycle based on the rising edge of the clock signal 2 to obtain the second intermediate signal 12a. The rising edge of the second intermediate signal 12a is slightly delayed with respect to the third rising edge of the clock signal 2. The third clock sub-circuit 13 delays the second intermediate signal 12a by one clock cycle to obtain the third intermediate signal 13a. The fourth clock sub-circuit 14 delays the third intermediate signal 13a by one clock cycle to obtain the fourth intermediate signal 14a. The fifth clock sub-circuit 15 delays the fourth intermediate signal 14a by one clock cycle to obtain the fifth intermediate signal 15a.

After receiving the initial pulse signal 1, the original delay circuit 40 delays the initial pulse signal 1 by a preset delay duration to obtain the original signal 40a, and the preset delay duration is the target duration. Due to a larger preset delay duration of the original delay circuit 40, the delay of the original signal 40a with respect to the initial pulse signal 1 may fluctuate greatly with respect to the target duration. In addition, the original delay circuit 40 is generally completely composed of inverters connected in series. The fluctuation range of the original signal 40a is determined by the number of inverters.

In the signal diagram shown in FIG. 5, the first signal selector 26 controls the output end of the first signal selector 26 to be communicated with the output end of the fifth delay sub-circuit 25 based on the first flag signal 20b. After receiving the fifth intermediate signal 15a output by the corresponding fifth clock sub-circuit 15, the physical delay circuit 20 further delays the fifth intermediate signal 15a to obtain the target signal 20a. The second signal selector 31 outputs the target signal 20a based on the second flag signal 31b. The latch 32 outputs the function pulse signal 30a based on the initial pulse signal 1 and the target signal 20a.

It should be noted that, in the process of actually connecting the D flip-flops and the inverters, if the delay of the target duration cannot be obtained exactly, the connection should be made according to a rule that an actual target duration should be larger rather than smaller, that is, the sum of the first delay duration and the second delay duration should not be less than the target duration. This ensures that a pulse width of a CSL signal can meet a preset requirement, that is, data reading and writing can be completed within the pulse width of the CSL signal. Based on the foregoing rule, when multiple typical values are included in a clock cycle interval, a minimum typical value may be selected to represent the clock cycle interval, so that when an actual clock cycle is short, a pulse width of a CSL signal can be controlled to meet a time requirement of reading and writing. Specifically, if the pulse width of the CSL signal can meet the preset requirement when the actual clock cycle is short, the pulse width of the CSL signal can certainly meet the preset requirements when the actual clock cycle is long.

In one embodiment, the first clock sub-circuit 11 may include a plurality of D flip-flops connected in series, the first clock cycle is 1.5 ns, the second clock cycle is 1.07/0.25 ns, the third clock cycle is 0.83 ns/0.93 ns, the fourth clock cycle is 0.75 ns, the fifth clock cycle is 0.625/0.68 ns, the target duration is 3.5 ns, and a preset output lag of a single inverter is 0.05 ns. Correspondingly, based on the foregoing rule, 1.07 ns is selected to represent the second clock cycle, 0.83 ns is selected to represent the third clock cycle, and 0.625 ns is selected to represent the fifth clock cycle.

A specific numeric value of the target duration may be determined according to a requirement for a pulse width of a CSL signal, and a numeric value interval of multiple clock cycles may be determined based on parameters of tccd. Taking a Dynamic Random Access Memory (DRAM) DDR4 chip as an example, corresponding relationships between the parameters of tccd and a data transmission rate, a clock frequency and a clock cycle is as follows.

and under the condition that the clock cycle is the first clock cycle, the sum of the first delay duration and the second delay duration is 1.5×2+0.05×10=3.5 ns. It may be configured as that the second clock sub-circuit 12 includes one D flip-flop, the second delay sub-circuit 22 includes 6 inverters and under the condition that the clock cycle is the second clock cycle, the sum of the first delay duration and the second delay duration is 1.07×3+0.05×6=3.51 ns. It may be configured that the third clock sub-circuit 13 includes one D flip-flop, the third delay sub-circuit 23 includes 4 inverters and under the condition that the clock cycle is the third clock cycle, the sum of the first delay duration and the second delay duration is 0.83 4+0.05×4=3.52 ns.

When the clock cycle is the fourth clock cycle, even if the fourth clock sub-circuit 14 includes only one D flip-flop, a first delay duration timeout will be caused, that is, 0.75× 5=3.75>3.5 ns. Therefore, the fourth clock sub-circuit 14 may be removed, or the fourth clock sub-circuit 14 may be provided as a non-delay wire, so that the output end of the third clock sub-circuit 13 is substantially connected to the input end of the third delay sub-circuit 23 and the input end of the fourth delay sub-circuit 24 separately. At the same time, it is configured as that the fourth delay sub-circuit 24 includes 10 inverters, so that when the clock cycle is the fourth clock cycle, the sum of the first delay duration and the second delay duration is 0.75×4+0.05×10=3.5 ns.

In other embodiments, it may be also configured as that each clock sub-circuit includes only 1 D flip-flop; or the first clock sub-circuit includes a first D flip-flop and a second D flip-flop, the data output end of the first D flip-flop is connected to the data input end of the second D flip-flop, the first D flip-flop is configured to receive the initial pulse signal and clock signal, the second D flip-flop is configured to receive the clock signal and output the first intermediate signal, and the second clock sub-circuit is connected in series between the first D flip-flop and the second delay sub-circuit. In this case, both the second clock sub-circuit and the third clock sub-circuit each contain only one D flip-flop.

In addition, when the first delay duration corresponding to the fourth intermediate signal 14a is equal to 4 clock cycles and the clock cycle is the fourth clock cycle, the number of inverters included in the fourth delay sub-circuit 24 is the same as the number of inverters included in the first delay sub-circuit 21. Therefore, the fourth delay sub-circuit 24 may be discarded, and it may be configured as that the first delay sub-circuit 21 is further configured to receive the fourth intermediate signal 14a and the first flag signal 20b, so as to receive the first intermediate signal 11a or the fourth intermediate signal 14a based on the first flag signal 20b.

| Tccd | Data transmission rate | Typical value | Clock frequency | Clock cycle |
| --- | --- | --- | --- | --- |
| 4 | Data rate ≤ 1333 Mbps | 1333 Mbps | 666.5 MHz | 1.5 ns |
| 5 | 1333 Mbps < Data rate ≤ 1866 Mbps | 1600/866 Mbps | 800/933 MHz | 1.07/1.25 ns |
| 6 | 1866 Mbps < Data rate ≤ 2400 Mbps | 2133/2400 Mbps | 1066.5/1200 MHz | 0.83/0.93 ns |
| 7 | 2400 Mbps < Data rate ≤ 2666 Mbps | 2666 Mbps | 1333 MHz | 0.75 ns |
| 8 | 2666 Mbps < Data rate ≤ 3200 Mbps | 2933/3200 Mbps | 1466.5/1600 MHz | 0.625/0.68 ns |

Based on the above examples and rules, it may be configured as that the first clock sub-circuit 11 includes 2 D flip-flops, the first delay sub-circuit 21 includes 10 inverters In addition, when the fourth clock sub-circuit 14 substantially has no delay, and the first delay duration corresponding to the fourth intermediate signal 14a is equal to 4 clock cycles, it may be configured as that the fifth clock sub-circuit 15 includes one D flip-flop, the fifth delay sub-circuit 25 includes 8 inverters, and under the condition that the clock cycle is the fifth clock cycle, the sum of the first delay duration and the second delay duration is 0.625×5+0.05× 8=3.525 ns.

When a preset output lag of a single inverter under normal conditions is 0.05 ns, in order to achieve a delay duration of 3.5 ns, 70 inverters successively connected in series are required to form an original delay circuit 40. Based on an assumption that the preset output lag of the inverter constituting each delay sub-circuit in the original delay circuit 40 and the physical delay circuit 20 fluctuates between 0.04 ns and 0.06 ns, where 0.06 ns is the preset output lag of the inverter under SS process corner, high temperature and low pressure conditions and 0.04 ns is the preset output lag of the inverter under FF process corner, low temperature and high pressure conditions, a difference between the use of the target signal 20a to generate the function pulse signal 30a and the use of the original signal 40a to generate the function pulse signal 30a will be described in detail.

In the case of the first clock cycle, the delay of the target signal 20a with respect to the initial pulse signal 1 is between 3.4 ns and 3.6 ns. In the case of the second clock cycle, the delay of the target signal 20a with respect to the initial pulse signal 1 is between 3.45 ns and 3.57 ns. In the case of the third clock cycle, the delay of the target signal 20a with respect the initial pulse signal 1 is between 3.48 ns and 3.56 ns. In the case of the fourth clock cycle, the delay of the target signal 20a with respect to the initial pulse signal 1 is between 3.4 ns and 3.6 ns. In the case of the fifth clock cycle, the delay of the target signal 20a with respect to the initial pulse signal 1 is between 3.445 ns and 3.605 ns. That is, in the case of different clock cycles, the pulse width of the function pulse signal 30a generated according to the target signal 20a and the initial pulse signal 1 is between 3.4 ns and 3.605 ns.

Correspondingly, the delay of the original signal 40a with respect to the initial pulse signal 1 is between 2.8 ns and 4.2 ns. It is apparent that the pulse width of the function pulse signal 30a obtained based on the target signal 20a and the initial pulse signal 1 has higher stability, and may be effectively applicable to different process corner conditions to ensure effective reading and writing of data.

In this embodiment, a clock delay circuit and a physical delay circuit are used together to delay an initial pulse signal to shorten a second delay duration that needs to be achieved by the physical delay circuit, thereby compressing the delay fluctuation caused by the physical delay circuit, making the delay of the target signal with respect to the initial pulse signal close to the target time, and thus accurately controlling the pulse width of the function pulse signal and improving the efficiency of the function pulse signal.

Correspondingly, the embodiments of this disclosure further provide a memory, including the signal generation circuit of any one of the foregoing embodiments. In this way, the memory has a higher reading and writing success rate, and the memory has higher reliability.

It can understand by persons of ordinary skill in the art that the above-mentioned implementations are specific embodiments for implementing this disclosure, and in practical disclosures, various changes may be made in form and detail without departing from the spirit and scope of this disclosure. Any person skilled in the art can make changes and modifications without departing from the spirit and scope of the disclosure. Therefore, the scope of protection of this disclosure shall be subject to the scope defined in the claims.

INDUSTRIAL APPLICABILITY

The embodiments of this disclosure provide a signal generation circuit and a memory. Based on the technical solutions provided by the embodiments of this disclosure, a clock delay circuit and a physical delay circuit may be used together to delay an initial pulse signal to shorten a second delay duration that needs to be implemented by the physical delay circuit, thereby compressing the delay fluctuation caused by the physical delay circuit, making the delay of a target signal with respect to an initial pulse signal close to a target time, and thus accurately controlling a pulse width of a function pulse signal and improving the efficiency of the function pulse signal.

In addition, the physical delay circuit may select a corresponding intermediate signal based on a numeric value of a clock cycle indicated by a first flag signal, so that a first delay duration of a clock delay circuit is less than a target duration, and the first delay duration corresponding to an intermediate signal accounts for a large proportion of the target duration, so as to shorten a second delay duration that needs to be implemented by a physical delay circuit as much as possible, and further reduce delay fluctuations caused by the physical delay.

The invention claimed is:

1. A signal generation circuit, comprising:
a clock delay circuit, configured to receive a clock signal and an initial pulse signal, and delay the initial pulse signal to output an intermediate signal, wherein the intermediate signal is delayed by a first delay duration with respect to the initial pulse signal, and the first delay duration is equal to one or more clock cycles of the clock signal;
a physical delay circuit, configured to receive and delay the intermediate signal to output a target signal, wherein a preset delay duration of the physical delay circuit is a second delay duration, wherein when an actual delay duration of the physical delay circuit is equal to the second delay duration, the target signal is delayed by a target duration with respect to the initial pulse signal, a difference between the actual delay duration and the second delay duration fluctuates within a first preset range, and the shorter the second delay duration, the narrower the first preset range; and
a generation circuit, configured to receive the initial pulse signal and the target signal, and output a function pulse signal, wherein a pulse width of the function pulse signal is equal to a time interval between a rising edge of the initial pulse signal and a rising edge of the target signal.

2. The signal generation circuit of claim 1, wherein the first delay duration is equal to n clock cycles,
the clock delay circuit is further configured to output a plurality of the intermediate signals, values of n corresponding to the different intermediate signals are different, and n is a positive integer; and
the physical delay circuit is further configured to receive a first flag signal indicating a numeric value of the clock cycle, and receive one of the plurality of the intermediate signals based on the first flag signal and adjust the second delay duration, so that a sum of the first delay duration and the second delay duration corresponding to the received intermediate signal is equal to the target duration.

3. The signal generation circuit of claim 1, wherein a numeric value of the clock cycle is one of a plurality of different numeric values, and the first delay duration changes as the numeric value of the clock cycle changes; and the physical delay circuit is further configured to adjust the second delay duration based on the first delay duration, so that a sum of the first delay duration and the second delay duration is equal to the target duration.

4. The signal generation circuit of claim 2, wherein the clock cycle comprises a first clock cycle or a second clock cycle;
the clock delay circuit is configured to output at least a first intermediate signal and a second intermediate signal, the first delay duration corresponding to the first intermediate signal is equal to x clock cycles, the first delay duration corresponding to the second intermediate signal is equal to y clock cycles, and x and y are positive integers;
the physical delay circuit comprises:
a first delay sub-circuit, configured to receive the first intermediate signal, wherein a sum of the preset delay duration of the first delay sub-circuit and x first clock cycles is equal to the target duration;
a second delay sub-circuit, configured to receive the second intermediate signal, wherein a sum of the preset delay duration of the second delay sub-circuit and y second clock cycles is equal to the target duration; and
a first signal selector, having a first input end connected to an output end of the first delay sub-circuit, a second input end connected to an output end of the second delay sub-circuit, and an output end connected to an input end of the generation circuit, and configured to receive a first flag signal, wherein when the first flag signal indicates that the clock cycle is the first clock cycle, the output end of the first signal selector is controlled to be communicated with the first input end, and when the first flag signal indicates that the clock cycle is the second clock cycle, the output end of the first signal selector is controlled to be communicated with the second input end.

5. The signal generation circuit of claim 4, wherein the first flag signal indicates a delay between adjacent column address strobe signals (CAS to CAS command delay).

6. The signal generation circuit of claim 4, wherein y>x; the clock delay circuit comprises:
a first clock sub-circuit, having an output end connected to an input end of the first delay sub-circuit, and configured to receive the initial pulse signal and output the first intermediate signal; and
a second clock sub-circuit connected between the first clock sub-circuit and the second delay sub-circuit, and configured to receive and delay the first intermediate signal and output the second intermediate signal.

7. The signal generation circuit of claim 6, wherein the first clock sub-circuit is composed of x delayers connected in series, the delayers each is configured to receive and delay a signal, and a delay duration of each of the delayers is equal to one clock cycle; and the second clock sub-circuit is composed of y-x delayers successively connected in series.

8. The signal generation circuit of claim 7, wherein a pulse width of the initial pulse signal is equal to the clock cycle, the rising edge of the initial pulse signal is the same as a rising edge of the clock signal, the delayers each is a D flip-flop, a trigger mode of the D flip-flop is edge trigger, and a trigger input end of the D flip-flop is configured to receive the clock signal.

9. The signal generation circuit of claim 4, wherein the clock cycle further comprises a third clock cycle, a fourth clock cycle or a fifth clock cycle;
the clock delay circuit is configured to output at least a third intermediate signal, a fourth intermediate signal and a fifth intermediate signal, the first delay duration corresponding to the third intermediate signal is equal to a clock cycles, the first delay duration corresponding to the fourth intermediate signal is equal to b clock cycles, the first delay duration corresponding to the fifth intermediate signal is equal to c clock cycles, and a, b and c are positive integers;
the physical delay circuit further comprises:
a third delay sub-circuit, configured to receive the third intermediate signal, wherein a sum of the preset delay duration of the third delay sub-circuit and a third clock cycles is equal to the target duration;
a fourth delay sub-circuit, configured to receive the fourth intermediate signal, wherein a sum of the preset delay duration of the fourth delay sub-circuit and b fourth clock cycles is equal to the target duration; and
a fifth delay sub-circuit, configured to receive the fifth intermediate signal, wherein a sum of the preset delay duration of the fifth delay sub-circuit and c fifth clock cycles is equal to the target duration;
wherein a third input end of the first signal selector is connected to an output end of the third delay sub-circuit, a fourth input end of the first signal selector is connected to an output end of the fourth delay sub-circuit, and a fifth input end of the first signal selector is connected to an output end of the fifth delay sub-circuit; and
the first flag signal is further used for indicating the third clock cycle, the fourth clock cycle or the fifth clock cycle, and the first signal selector is further configured to control the output end of the first signal selector to be connected to an output end of the third delay sub-circuit, an output end of the fourth delay sub-circuit or an output end of the fifth delay sub-circuit based on the first flag signal.

10. The signal generation circuit of claim 1, further comprising:
an original delay circuit, configured to receive and delay the initial pulse signal to output an original signal, wherein a preset delay duration of the original delay circuit is the target duration, a difference between an actual delay duration of the original delay circuit and the target duration fluctuates within a second preset range, and the shorter the target duration, the narrower the second preset range;
the generation circuit comprises:
a second signal selector, configured to receive the original signal and the target signal, receive a second flag signal, and output the original signal or the target signal based on the second flag signal; and
a latch, configured to receive the initial pulse signal and receive the original signal or the target signal, wherein when the original signal is received, the pulse width of the function pulse signal is equal to a time interval between the rising edge of the initial pulse signal and a rising edge of the original signal.

11. The signal generation circuit of claim 10, wherein the latch has a first input end and a second input end, the first input end is configured to receive the initial pulse signal, the second input end is configured to receive the target signal or the original signal, and when it is detected that a level of the first input end changes to a high level, the latch is configured to continuously output a high level signal until it is detected that a level of the second input end of the latch changes to a high level and the output high level of the latch changes back to a low level.

12. The signal generation circuit of claim 1, wherein the physical delay circuit is composed of m inverters successively connected in series, m is an even number, each of the m inverters has a preset output lag, and a sum of the m preset output lags is equal to the second delay duration; and the smaller m, the narrower the first preset range.

13. The signal generation circuit of claim 1, wherein the function pulse signal is a column select signal (CSL).

14. A memory, comprising a signal generation circuit comprising:
a clock delay circuit, configured to receive a clock signal and an initial pulse signal, and delay the initial pulse signal to output an intermediate signal, wherein the intermediate signal is delayed by a first delay duration with respect to the initial pulse signal, and the first delay duration is equal to one or more clock cycles of the clock signal;
a physical delay circuit, configured to receive and delay the intermediate signal to output a target signal, wherein a preset delay duration of the physical delay circuit is a second delay duration, wherein when an actual delay duration of the physical delay circuit is equal to the second delay duration, the target signal is delayed by a target duration with respect to the initial pulse signal, a difference between the actual delay duration and the second delay duration fluctuates within a first preset range, and the shorter the second delay duration, the narrower the first preset range; and
a generation circuit, configured to receive the initial pulse signal and the target signal, and output a function pulse signal, wherein a pulse width of the function pulse signal is equal to a time interval between a rising edge of the initial pulse signal and a rising edge of the target signal.

15. The memory of claim 14, wherein the first delay duration is equal to n clock cycles,
the clock delay circuit is further configured to output a plurality of the intermediate signals, values of n corresponding to the different intermediate signals are different, and n is a positive integer; and
the physical delay circuit is further configured to receive a first flag signal indicating a numeric value of the clock cycle, and receive one of the plurality of the intermediate signals based on the first flag signal and adjust the second delay duration, so that a sum of the first delay duration and the second delay duration corresponding to the received intermediate signal is equal to the target duration.

16. The memory of claim 14, wherein a numeric value of the clock cycle is one of a plurality of different numeric values, and the first delay duration changes as the numeric value of the clock cycle changes; and the physical delay circuit is further configured to adjust the second delay duration based on the first delay duration, so that a sum of the first delay duration and the second delay duration is equal to the target duration.

17. The memory of claim 15, wherein the clock cycle comprises a first clock cycle or a second clock cycle;
the clock delay circuit is configured to output at least a first intermediate signal and a second intermediate signal, the first delay duration corresponding to the first intermediate signal is equal to x clock cycles, the first delay duration corresponding to the second intermediate signal is equal to y clock cycles, and x and y are positive integers;
the physical delay circuit comprises:
a first delay sub-circuit, configured to receive the first intermediate signal, wherein a sum of the preset delay duration of the first delay sub-circuit and x first clock cycles is equal to the target duration;
a second delay sub-circuit, configured to receive the second intermediate signal, wherein a sum of the preset delay duration of the second delay sub-circuit and y second clock cycles is equal to the target duration; and
a first signal selector, having a first input end connected to an output end of the first delay sub-circuit, a second input end connected to an output end of the second delay sub-circuit, and an output end connected to an input end of the generation circuit, and configured to receive a first flag signal, wherein when the first flag signal indicates that the clock cycle is the first clock cycle, the output end of the first signal selector is controlled to be communicated with the first input end, and when the first flag signal indicates that the clock cycle is the second clock cycle, the output end of the first signal selector is controlled to be communicated with the second input end.

18. The memory of claim 17, wherein the first flag signal indicates a delay between adjacent column address strobe signals (CAS to CAS command delay).

19. The memory of claim 17, wherein y>x;
the clock delay circuit comprises:
a first clock sub-circuit, having an output end connected to an input end of the first delay sub-circuit, and configured to receive the initial pulse signal and output the first intermediate signal; and
a second clock sub-circuit connected between the first clock sub-circuit and the second delay sub-circuit, and configured to receive and delay the first intermediate signal and output the second intermediate signal.

20. The memory of claim 19, wherein the first clock sub-circuit is composed of x delayers connected in series, the delayers each is configured to receive and delay a signal, and a delay duration of each of the delayers is equal to one clock cycle; and the second clock sub-circuit is composed of y-x delayers successively connected in series.

* * * * *